United States Patent
Kaikkonen et al.

(10) Patent No.: US 9,860,972 B2
(45) Date of Patent: Jan. 2, 2018

(54) ELECTRICAL CONNECTION INTERFACE FOR CONNECTING ELECTRICAL LEADS FOR HIGH SPEED DATA TRANSMISSION

(71) Applicant: FINISAR CORPORATION, Sunnyvale, CA (US)

(72) Inventors: Andrei Kaikkonen, Jarfalla (SE); Doron Lapidot, Tokyo (JP); Lennart Lundqvist, Jarfalla (SE); Lars-Gote Svensson, Sollentuna (SE)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 14/723,662

(22) Filed: May 28, 2015

(65) Prior Publication Data
US 2015/0264803 A1 Sep. 17, 2015

Related U.S. Application Data

(63) Continuation of application No. PCT/EP2013/063694, filed on Jun. 28, 2013.

(30) Foreign Application Priority Data

Nov. 28, 2012 (EP) .................................... 12194674

(51) Int. Cl.
*H05K 1/02* (2006.01)
*H05K 1/14* (2006.01)
(Continued)

(52) U.S. Cl.
CPC ........... *H05K 1/0218* (2013.01); *H05K 1/028* (2013.01); *H05K 1/0225* (2013.01);
(Continued)

(58) Field of Classification Search
CPC .... H01R 13/6585; H01R 12/62; H01R 12/68; H01R 13/6461; H01R 13/6466;
(Continued)

(56) References Cited

U.S. PATENT DOCUMENTS 3,703,604 A 11/1972 Henschen et al.
3,818,117 A 6/1974 Reyner
(Continued)

FOREIGN PATENT DOCUMENTS

JP 2007123742 A 5/2007
JP 2012182173 A 9/2012

OTHER PUBLICATIONS

PCT Written Opinion of the International Searching Authority and International Search Report, International Application No. PCT/EP2013/063694, dated Sep. 27, 2013, 12 pages.

*Primary Examiner* — Michael P McFadden
(74) *Attorney, Agent, or Firm* — Maschoff Brennan

(57) ABSTRACT

An electrical connection interface is provided. The electrical connection interface includes a first ground plane layer, a second ground plane layer, a first substrate and a second substrate. The second ground plane layer is positioned to overlap the first ground plane layer. The first substrate includes a first substrate conductive lead with a first interface region connected to and electrically insulated from the first ground plane layer. The second substrate includes a second substrate conductive lead with a second interface region connected to the first substrate conductive lead and the second ground plane layer. The second substrate conductive lead is electrically insulated from the second ground plane layer.

17 Claims, 15 Drawing Sheets

(51) Int. Cl.
    *H05K 1/09*    (2006.01)
    *H05K 1/11*    (2006.01)
    *H05K 3/36*    (2006.01)
    *H05K 1/03*    (2006.01)

(52) U.S. Cl.
    CPC ......... *H05K 1/0253* (2013.01); *H05K 1/0306* (2013.01); *H05K 1/09* (2013.01); *H05K 1/11* (2013.01); *H05K 1/14* (2013.01); *H05K 3/368* (2013.01); *H05K 1/0245* (2013.01); *H05K 2201/09827* (2013.01)

(58) Field of Classification Search
    CPC ............ H01R 13/6471; H01R 13/6474; H01R 13/6597; H01R 2107/00; H01R 24/64; H01R 29/00; H01R 31/08; H01R 9/032; H05K 1/0218; H05K 1/0225; H05K 1/0253; H05K 1/028; H05K 1/0306; H05K 1/09; H05K 1/11; H05K 1/14; H05K 1/0245; H05K 3/368; H05K 2201/09827
    USPC .......................................................... 361/803
    See application file for complete search history.

(56) References Cited

U.S. PATENT DOCUMENTS

| | | | |
|---|---|---|---|
| 5,808,529 A * | 9/1998 | Hamre | .................... H01P 1/047 333/238 |
| 6,206,507 B1 | 3/2001 | Hino | |
| 8,764,460 B2 | 7/2014 | Smink et al. | |
| 2005/0190006 A1 | 9/2005 | Noda et al. | |
| 2007/0206906 A1* | 9/2007 | Stark | .................... G02B 6/4201 385/89 |
| 2011/0269346 A1 | 11/2011 | Casher et al. | |
| 2012/0302075 A1 | 11/2012 | Muraoka et al. | |
| 2013/0001410 A1 | 1/2013 | Zhao et al. | |
| 2014/0051288 A1* | 2/2014 | Smink | ................ H01R 13/6461 439/607.01 |
| 2015/0098680 A1* | 4/2015 | Leigh | .................... G02B 6/428 385/88 |
| 2015/0180578 A1* | 6/2015 | Leigh | ................... G02B 6/4284 398/135 |

\* cited by examiner

ELECTRICAL CONNECTION INTERFACE FOR CONNECTING ELECTRICAL LEADS FOR HIGH SPEED DATA TRANSMISSION

CROSS-REFERENCE TO RELATED APPLICATIONS

This application is a continuation of PCT International Application No. PCT/EP2013/063694 filed Jun. 28, 2013, which claims priority under 35 U.S.C. §119 to European Patent No. 12194674.3 filed Nov. 28, 2012.

FIELD OF THE INVENTION

The invention relates to an electrical connection interface and, more particularly, to an electrical connection interface for connecting electrical leads for high speed data transmission.

BACKGROUND

Due to the high data rates in recently developed communication systems having data transmission rates, for example, 25 Gbps, signal integrity, such as, for instance, the reduction of cross-talk between signal lines, has become a major concern.

Ideally, an interconnection system will carry signals without distortion. One type of distortion is called cross-talk. Cross-talk occurs when one signal creates an unwanted signal on another signal line. Generally, cross-talk is caused by electromagnetic coupling between signal lines. Therefore, cross-talk is a particular problem for high-speed, high-density interconnection systems. Electromagnetic coupling increases when signal lines are closer together or when the signals they carry are of a higher frequency. Both of these conditions are present in a high-speed, high-density interconnection system. Discontinuities in the connector often exacerbate any cross-talk problems. It is generally known to insert a shield into the connectors in the connection system in order to reduce the impact of cross-talk.

Furthermore, it is known to use differential signals for transporting information. One differential signal is carried on two conductors, with the signal being represented as the difference in electrical levels between the conductors. A differential signal is more resistant to cross-talk than a single-ended signal, because any stray signals impinging on the conductors will generally change the level on both conductors, but do not alter the difference in levels.

Consequently, conventional high-speed transmission assemblies use circuit boards as a substrate to be connected to another board having a pair of wires for carrying each differential signal. A first printed circuit board has traces and pads on at least one of its surfaces, wherein particular contact pads are to be contacted by being soldered to mating contact pads on a second printed circuit board. The traces transmit electrical signals across the respective first and second printed circuit boards.

The transition from the first printed circuit board to the second printed circuit board of course needs to be capable of handling the high data rates as well. Moreover, due to the small form factor of the interconnect, cross-talk between adjacent or even further remote pairs of lines is an important parameter. Ground plane layers are typically used for shielding the lines against signal distortions.

However, at the electrical connection interface where two printed circuit boards are soldered, impedance compensation has to be used in order avoid distortions of the signal due to signal reflection. Therefore, conventional electrical connection interfaces dispense with internal ground layers in the particular region where the conductive pads of the traces are soldered to each other. An electrical connection between the ground plane layers of the first and second printed circuit board is established by providing ground-to-ground interconnecting leads that extend over the ground plane free gap. The size of such a board-to-board interconnect can be rather significant, typically 1200 μm per differential pair of signals, considering current reflow soldering technology allowing minimum 200 μm spacing between solder balls and restricting solder ball width to 200 μm.

Thereby, however, cross-talk between the signal lines and other effects degrading the signal integrity are no longer eliminated effectively enough.

SUMMARY

The object underlying the invention, therefore, is to improve a high-speed board-to-board connection interface with regard to signal integrity and cross-talk reduction, at the same time maintaining the small form factor and the cost-effective construction.

Accordingly, an electrical connection interface is provided. The electrical connection interface includes a first ground plane layer, a second ground plane layer, a first substrate and a second substrate. The second ground plane layer is positioned to overlap the first ground plane layer. The first substrate includes a first substrate conductive lead with a first interface region connected to and electrically insulated from the first ground plane layer. The second substrate includes a second substrate conductive lead with a second interface region connected to the first substrate conductive lead and the second ground plane layer. The second substrate conductive lead is electrically insulated from the second ground plane layer.

BRIEF DESCRIPTION OF THE DRAWINGS

The above and other features of the invention will become more apparent by describing in detail exemplary embodiments thereof with reference to the accompanying drawings, in which.

DETAILED DESCRIPTION OF THE EMBODIMENT(S)

The accompanying drawings are incorporated into and form a part of the specification to illustrate several embodiments of the invention. These drawings, together with the description, serve to explain the principles of the invention. The drawings are merely for the purpose of illustrating the preferred and alternative examples of how the invention can be made and used, and are not to be construed as limiting the invention to only the illustrated and described embodiments. Furthermore, several aspects of the embodiments may form—individually or in different combination—solutions according to the invention. Further features and advantages will become apparent from the following more particular description of the various embodiments of the invention, as illustrated in the accompanying drawings, in which like references numerals refer to like elements.

Figure 1:
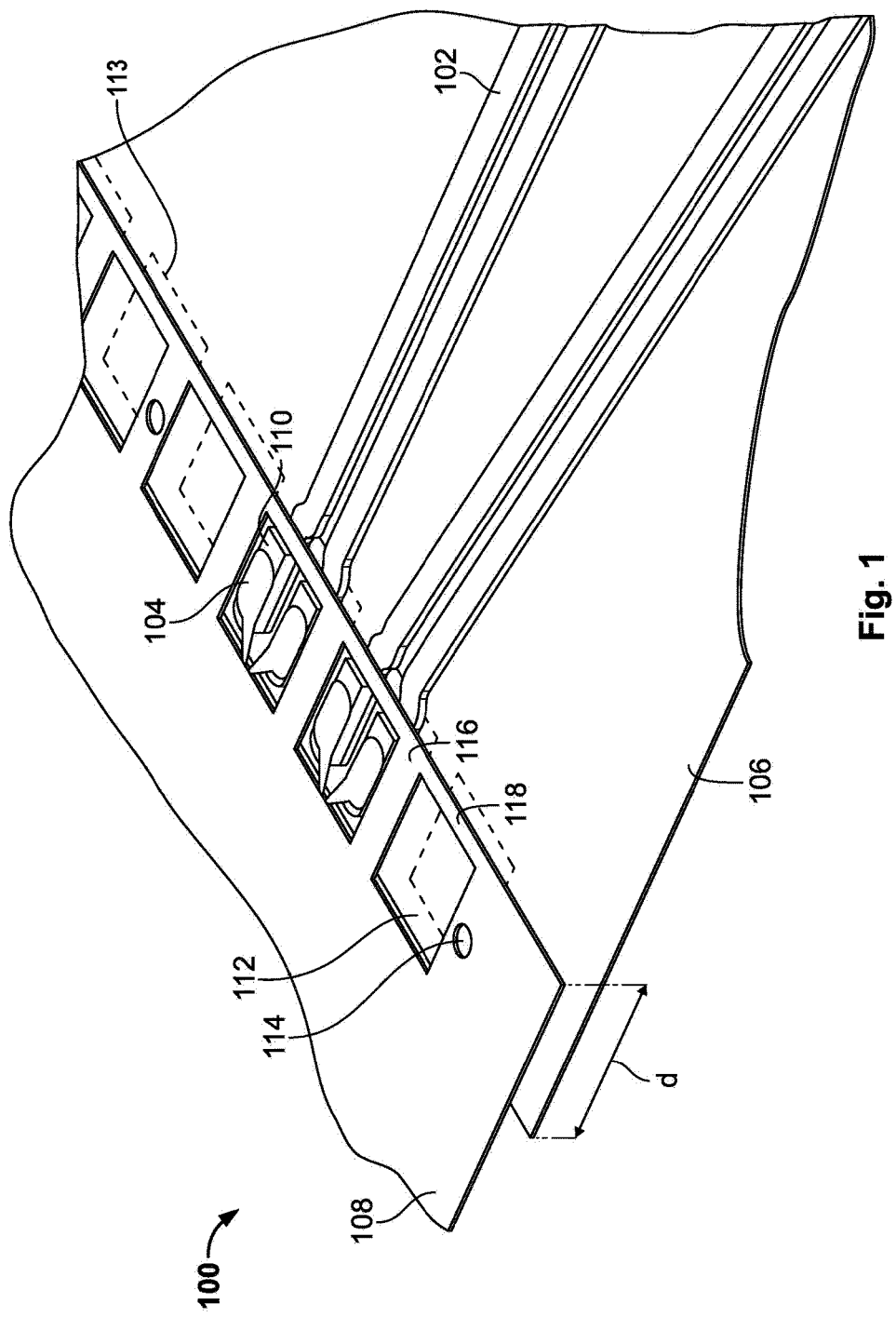
FIG. 1 is a partial perspective view of an electrical connection interface according to the invention.

Referring now to FIG. 1, an electrical connection interface 100 according to the invention is shown.

In FIG. 1, only the metallic parts, (i.e. the signal leads and the ground plane layers), are shown for sake of brevity. However, of course, insulating layers are also present and furthermore, the shown metallic layers do not have to be the only electrically conductive layers. For instance, each printed circuit board may contain embedded active and passive components and, furthermore, also more than two circuit boards can be stacked, interconnecting same by means of more than one electrical connection interface 100.

According to the invention, as shown in FIG. 1, the electrical connection interface 100 is used for connecting two printed circuit boards (PCB). A first substrate (not shown in the figure) carries two pairs of first electrically conductive leads. On the substrate of a second PCB (not shown in the figure) second electrically conductive leads 104 are provided. The shown number of leads is of course only intended to give a particular example. Any other desired number of electrically conductive leads is of course also possible.

As shown in FIG. 1, a first ground plane layer 106 is arranged on the first PCB. A second ground plane layer 108 is arranged on an opposing second PCB. Each of these ground plane layers are either located within the printed circuit board or situated on a surface opposing to the one where the respective electrically conductive leads 102, 104, are arranged.

According to the invention, the ground plane layers 106, 108 overlap in the area of the electrical connection interface 100, as indicated by the distance "d." The distance "d" may have dimensions of about 1 mm, when assuming a solder ball size of 500 µm×200 µm×80 µm. Each first electrically conductive lead 102 is connected to the corresponding second electrically conductive lead 104 by means of a solder ball 110. However, when providing an overlapping of the two ground plane layers 106, 108 according to the invention, of course also other electrically conducting connection techniques, such as press fit pins can be used for connecting the signal leads. For establishing the solder connection, each first and second electrically conductive lead 102, 104 has a solder pad structure in the interface region.

In the shown embodiment, adjacent to each differential pair of solder pads, a clearance 112 is provided in the first ground plane layer 106. These clearances, which sometimes are also referred to as anti-pads, are provided in order to adjust the differential impedance profile of the transmission lines. In FIG. 1, only two pairs of first and second electrically conductive leads 102, 104, are shown. However, one skilled in the art should appreciate that there can be many more leads in parallel. In FIG. 1, an electrical connection between the first ground plane layer 106 and the second ground plane layer 108 is schematically represented by the connection points 114. For instance, solid ground interconnects may be provided as connection points 114 between the first and second ground plane layers every fourth differential pair of signal pads. The solder balls 110 may have dimensions of 500 µm×200 µm×80 µm.

Furthermore, the two leads of each pair of the first electrically conductive leads 102 may be distanced apart by 200 µm, whereas the adjacent pairs are distanced apart for instance by 350 µm. The first and second electrically conductive leads 102, 104, may have a total length of, for instance, 11 mm and 3 mm, respectively.

As shown in FIG. 1, each of the clearances 112 is separated from an adjacent one by means of a grounding web 116 provided in the second ground plane layer 108. Furthermore, a cross-talk suppression strip 118 is formed at the margin of the second ground plane layer 108. By using this particular design, a two-fold effect can be achieved. First, a part of the second ground layer 108 is still present in the interconnection area providing an effect equal to an ESD shield. On the other hand, to achieve the necessary impedance match and, therefore, to avoid signal reflection, a cut-out is present in a region where the first and second electrically leads 102 and 104 are connected to each other. Therefore, cross-talk components can be blocked while still maintaining an unaltered (or only marginally different) differential impedance.

In FIG. 1, only the second ground plane layer 108 is provided with clearances 112. However, additionally or alternatively, such clearances can also be provided in the first ground plane layer 106, as denoted at 113.

Figure 2:
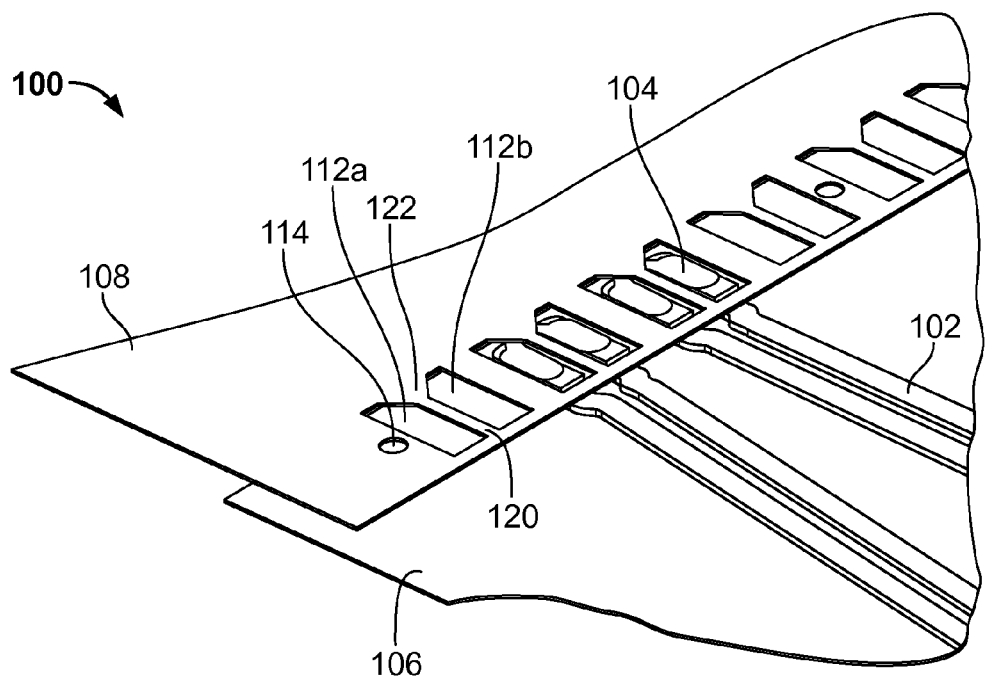
FIG. 2 is a partial perspective view of another electrical connection interface according to the invention.

With respect to FIG. 2, another electrical connection interface 100 according to the invention is shown. According to this embodiment, the second ground plane layer 108 is modified in that each of the clearances 112 of FIG. 1 is partitioned into two clearances 112a and 112b by an additional grounding web 120. By introducing such a short strip of conducting line in the middle of the clearance 112, between the two signal pads, a further improvement to the common mode impedance and the mode conversion can be achieved. In particular, the additional grounding web 120 is widened in the regions of the traces 104, where they escape and diverge to the solder pads. Such a tapered region 122 reduces the self-inductance and, thus, improves the signal integrity.

With the arrangement of FIG. 2, connection between the first ground plane layer 106 and the second ground plane layer 108 may either be performed in a GSSSSG configuration or a GSSG configuration, wherein G is ground and S is signal. The first configuration with fewer connection points 114 between the two ground plane layers has advantages in view of the necessary space, whereas providing more connection points is more advantageous in cases where common mode impedance, mode conversion and cross-talk are very critical.

Figure 3:
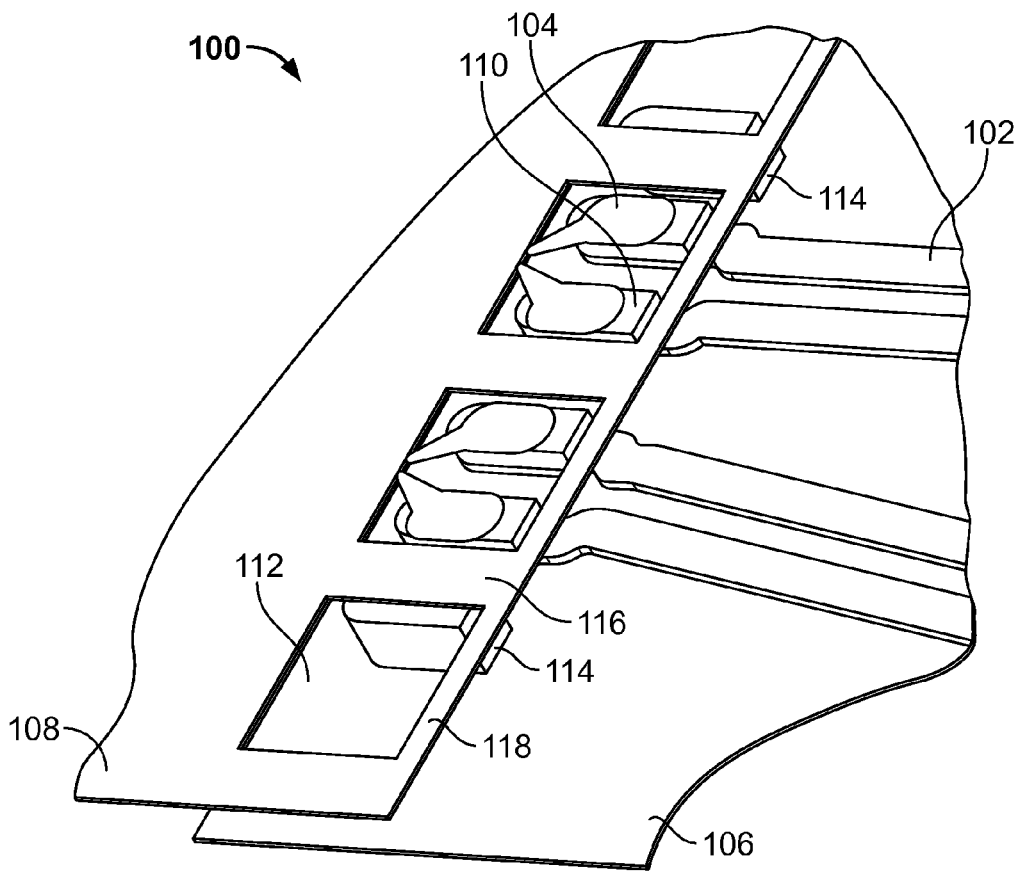
FIG. 3 is a partial perspective view of another electrical connection interface according to the invention.

In particular, FIG. 3 shows the more robust GSSG configuration with connection points 114 provided between every second differential pair of signal pads.

Figure 4:
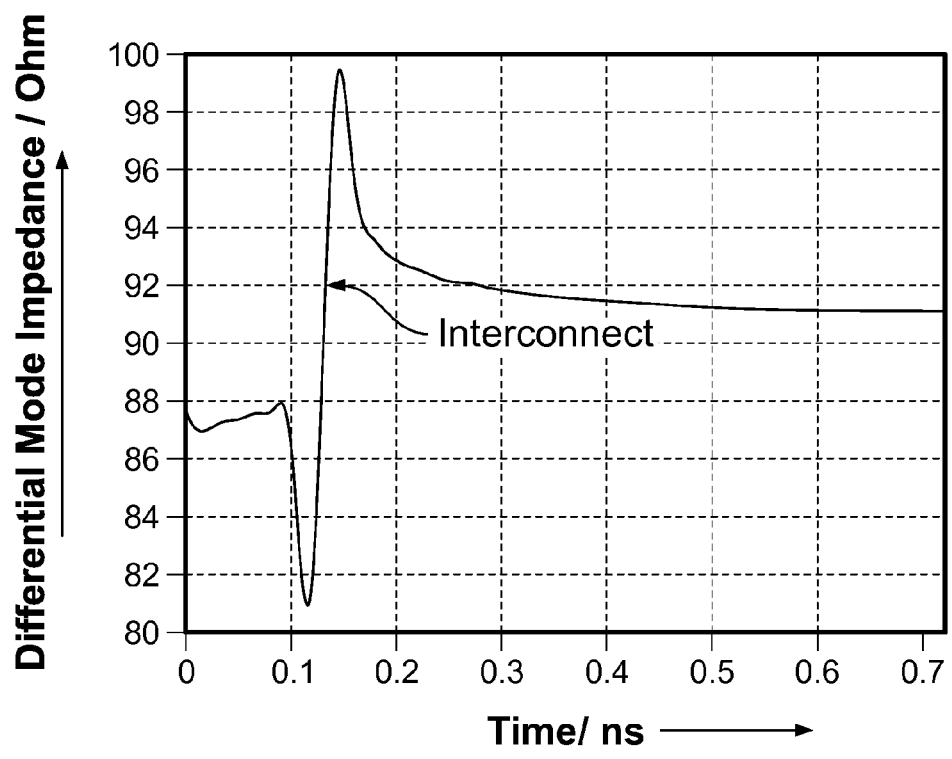
FIG. 4 is a schematic diagram showing a differential mode impedance profile of first signal leads of the electrical connection interface of FIG. 1.
Figure 5:
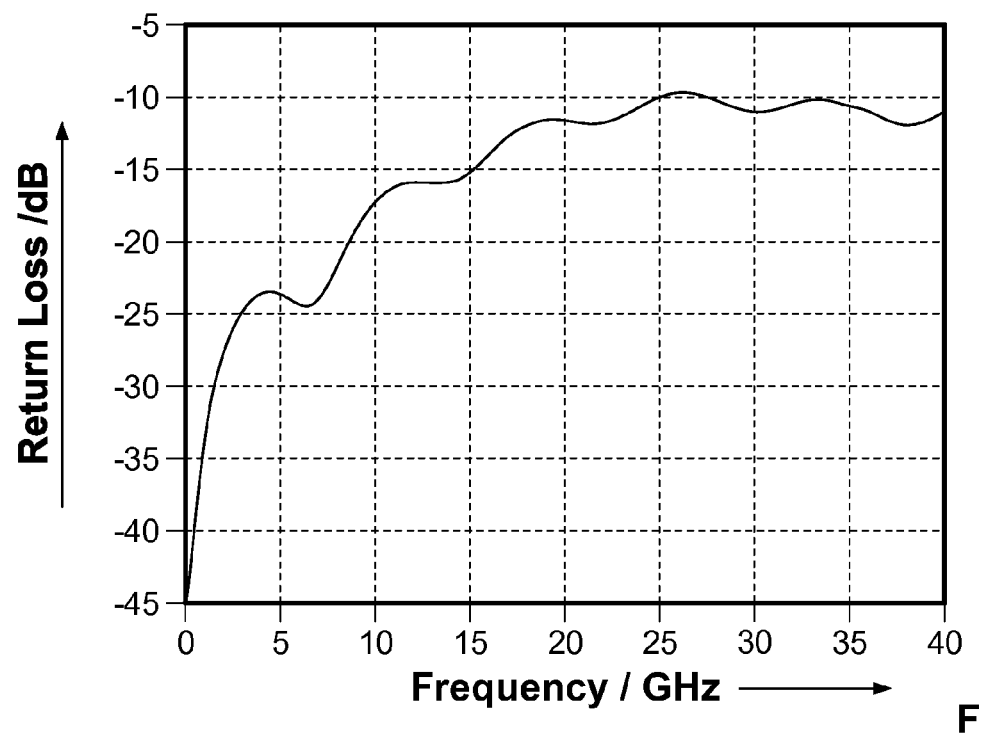
FIG. 5 is a schematic diagram showing a return loss corresponding to the impedance profile of FIG. 4.

With respect to FIGS. 4 to 9, actual performance of the arrangement according to FIG. 1 is shown. In particular, FIG. 4 shows a differential mode impedance profile from the side of the first electrically conductive leads 102 for a 15 ps 20% to 80% rise time at a nominal impedance of 90Ω. The return loss corresponding to the impedance profile of FIG. 4 is shown in FIG. 5.

Return loss is a frequency domain parameter analogous to the time domain impedance profile. Return loss (RL) is defined as the amount of signal energy reflected back towards the source as a result of impedance mismatches in the transmission path.

Figure 6:
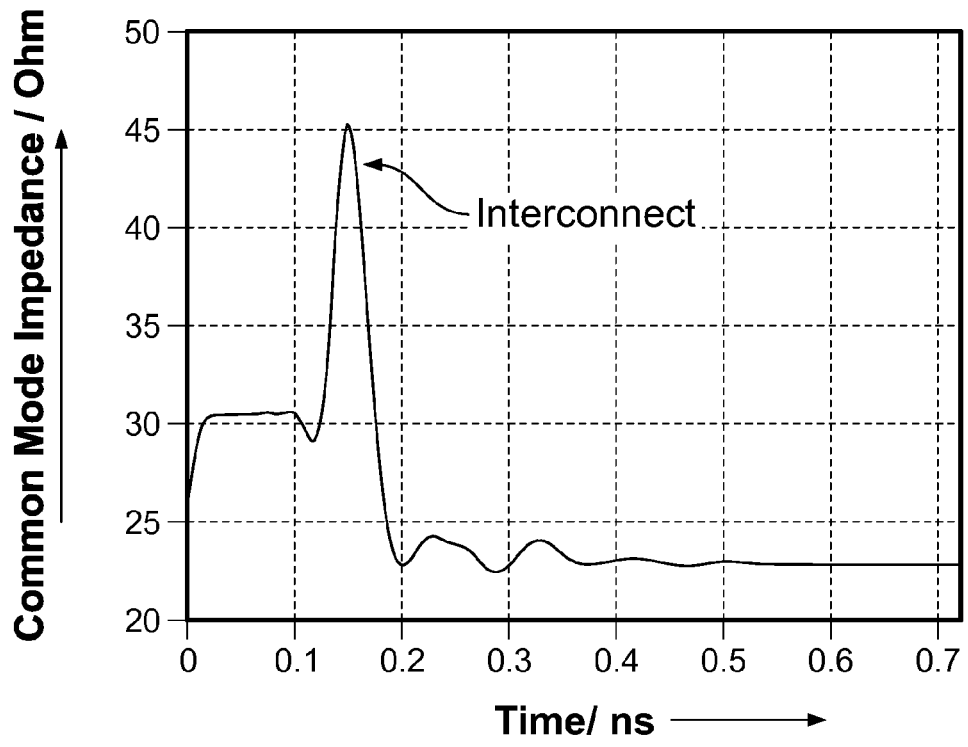
FIG. 6 is a schematic diagram showing a common mode impedance profile of first signal leads of the electrical connection interface of FIG. 1.
Figure 7:
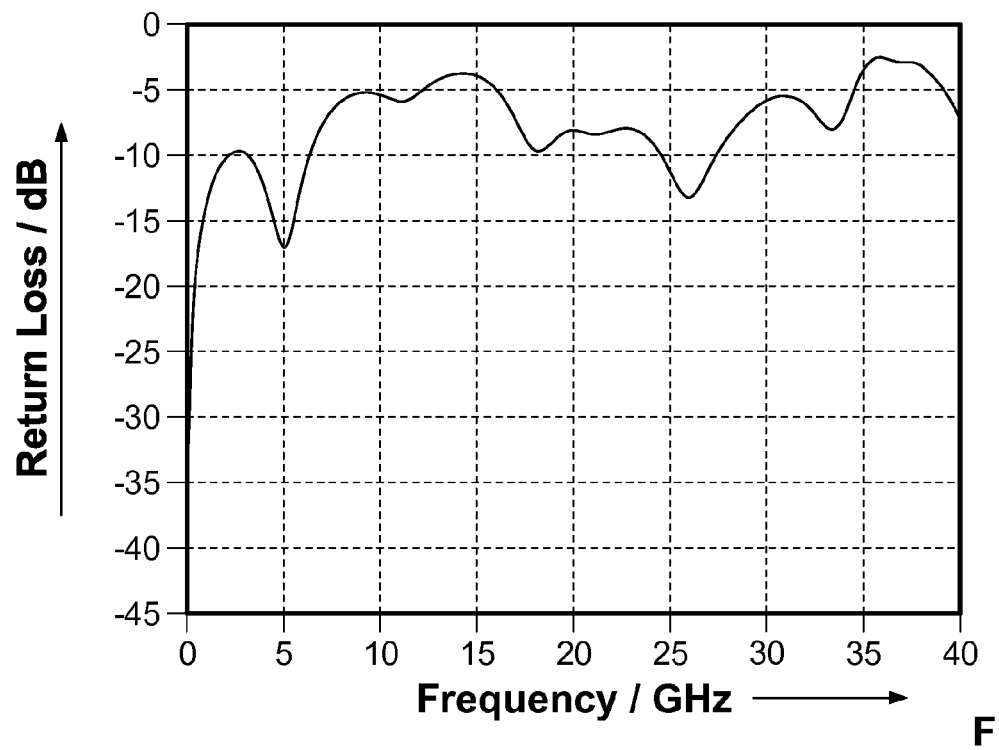
FIG. 7 is a schematic diagram shown a return loss corresponding to the impedance profile of FIG. 6.

Further, FIG. 6 shows the common mode impedance profile from the side of the first signal leads with a 15 ps 20% to 80% rise time for the embodiment of FIG. 1 at a nominal impedance of 22.5Ω. FIG. 7 shows the return loss corresponding to the impedance profile of FIG. 6.

As already indicated above, cross-talk is often a critical parameter to consider when selecting an interconnect for a high speed application. Cross-talk can be defined as noise arising from unwanted coupling of nearby signal lines. It occurs when two signals are partially superimposed on each other by inductive and capacitive coupling between the conductors carrying the signals. Cross-talk can result in distortion and degradation of the desired signals. There are two types of crosstalk of concern in high speed systems: near end crosstalk (NEXT) and far end crosstalk (FEXT). NEXT is the measure of the level of crosstalk at the transmitting end of the signal path, while FEXT is the measure of crosstalk at the receiving end of the signal path.

Figure 8:
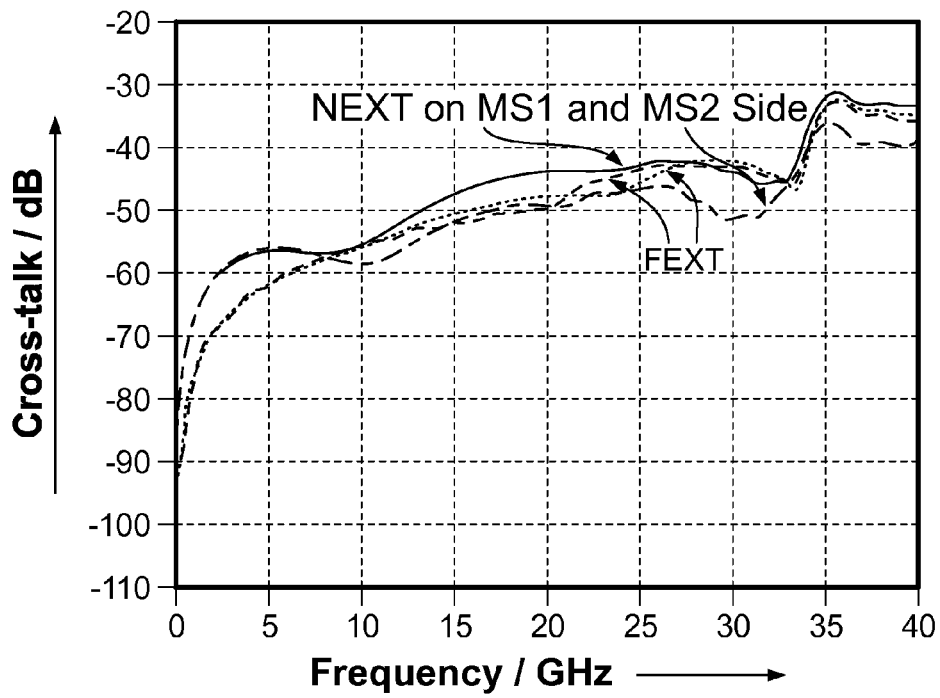
FIG. 8 is a schematic diagram showing near end cross-talk and far end cross-talk for the electrical connection interface of FIG. 1.
Figure 9:
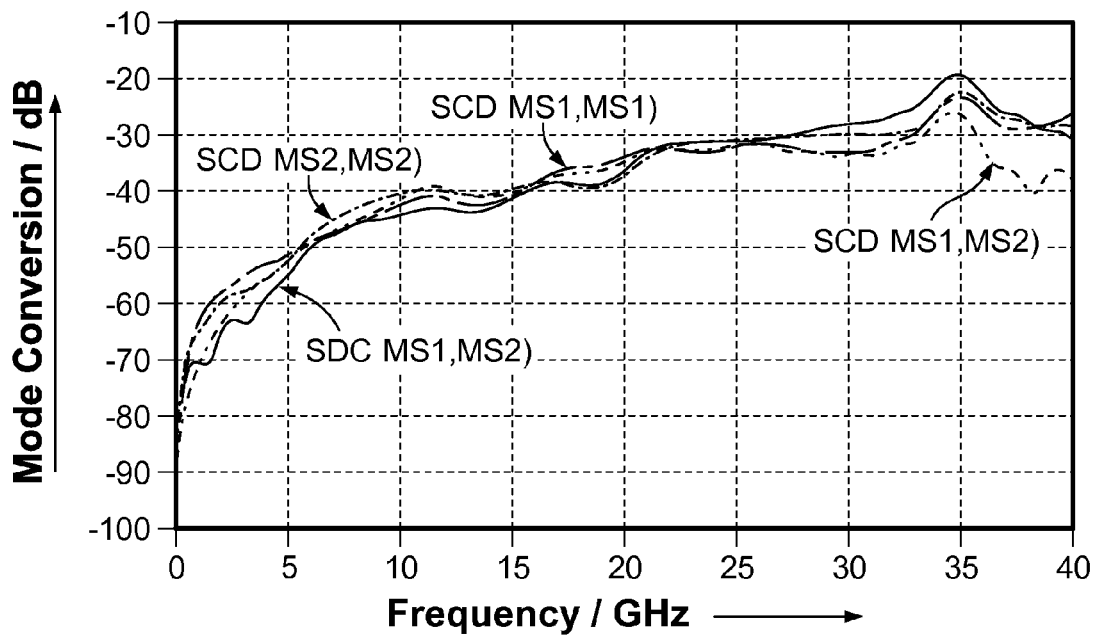
FIG. 9 is a schematic diagram showing a mode conversion for the interconnect shown in FIG. 1.

FIG. 8 shows the near end cross-talk and the far end cross-talk for the embodiment of FIG. 1 and FIG. 9 shows the mode conversion for the interconnect shown in FIG. 1. In these Figures, MS1 and MS2 signify the first and second electrically conductive leads, respectively. For the embodiment of FIG. 1, the insertion loss vs. cross-talk ratio is about 47 dB at 14 GHz and 30 dB at 35 GHz. As this is known to a person skilled in the art, a value of 30 dB corresponds to the typical transceiver dynamic range.

Now with reference to FIGS. 10 to 15, performance of the arrangement according to FIG. 3 is shown.

Figure 10:
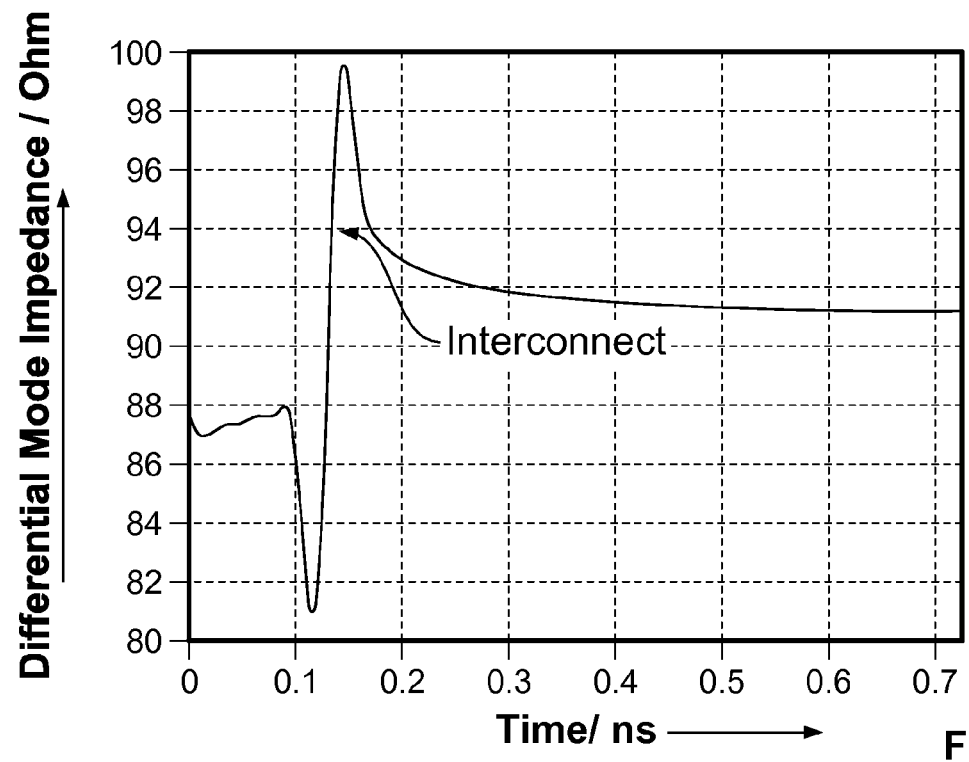
FIG. 10 is a schematic diagram showing a differential mode impedance profile of first signal leads of the electrical connection interface of FIG. 3.
Figure 11:
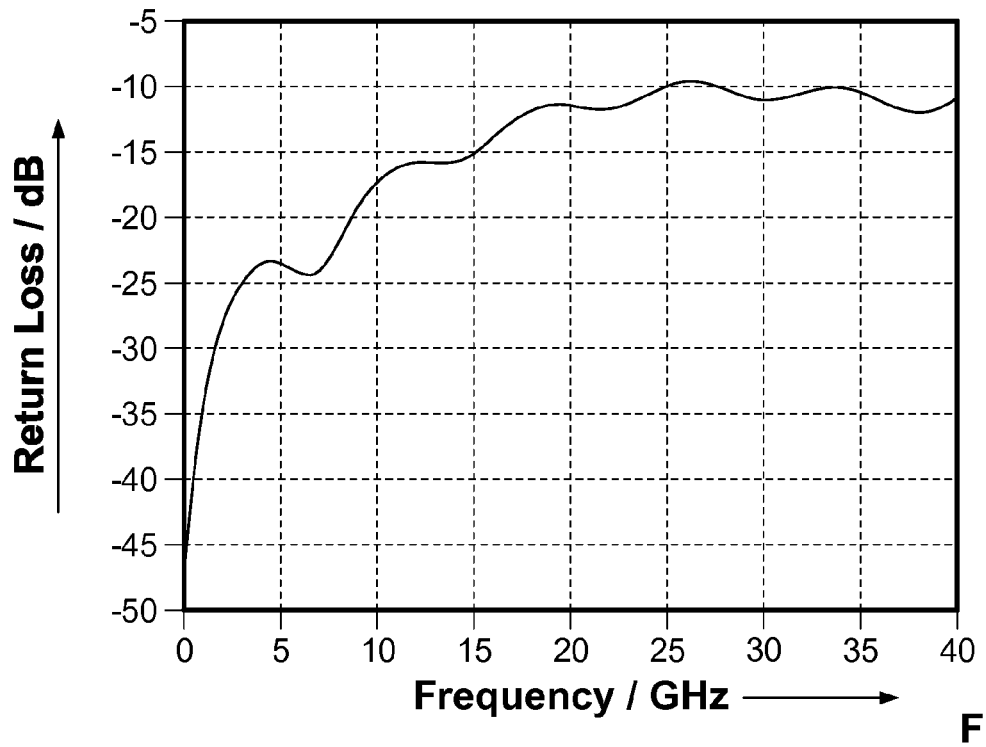
FIG. 11 is a schematic diagram showing a return loss corresponding to the impedance profile of FIG. 10.

Specifically, FIG. 10 shows the differential mode impedance profile from the side of the first signal leads with a 15 ps 20% to 80% rise time at a nominal impedance of 90Ω for the embodiment shown in FIG. 32, and FIG. 11 shows the return loss corresponding to the impedance profile of FIG. 10.

Figure 12:
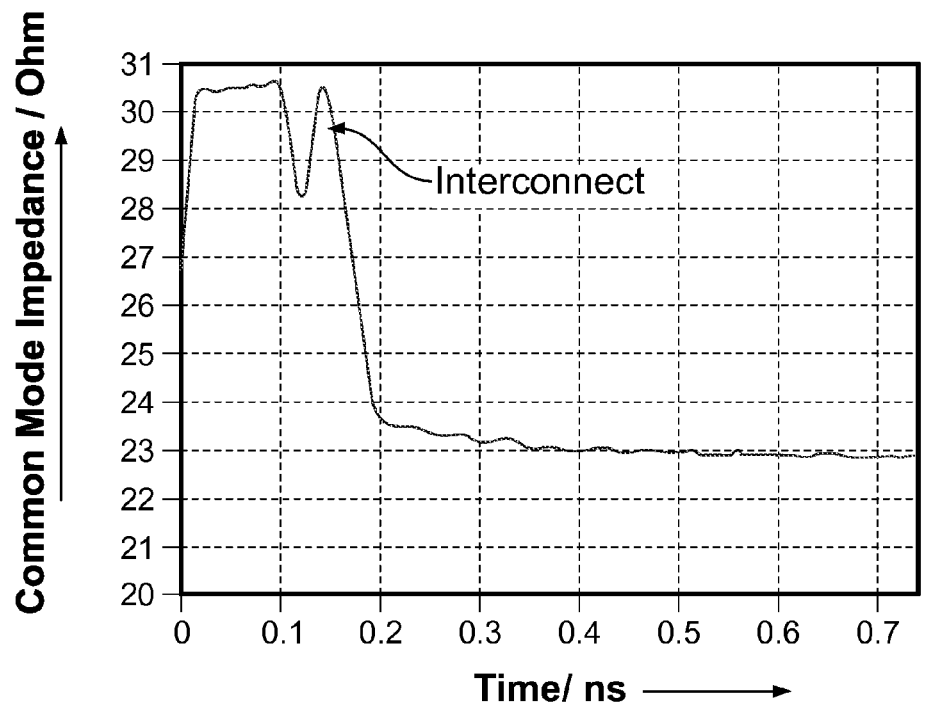
FIG. 12 is a schematic diagram showing a common mode impedance profile of the first signal leads of the electrical connection interface of FIG. 3.
Figure 13:
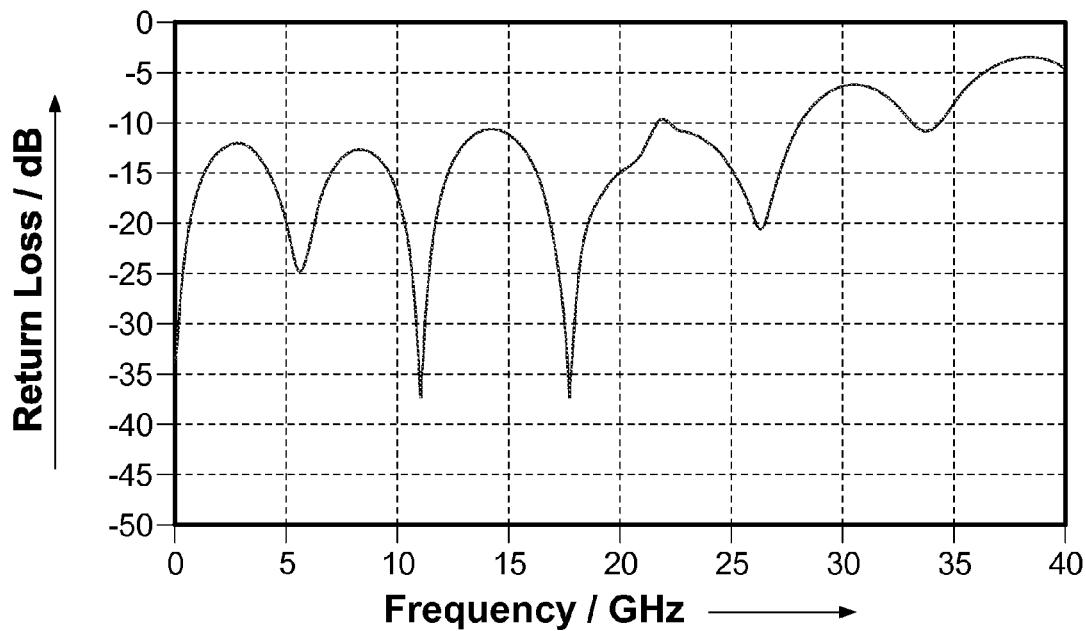
FIG. 13 is a schematic diagram showing a return loss corresponding to the impedance profile of FIG. 12.

Further, FIG. 12 shows the common mode impedance profile from the side of the first signal leads with a 15 ps 20% to 80% rise time at a nominal impedance of 22.5Ω for the embodiment of FIG. 3, and FIG. 13 shows the return loss corresponding to the impedance profile of FIG. 12.

Figure 14:
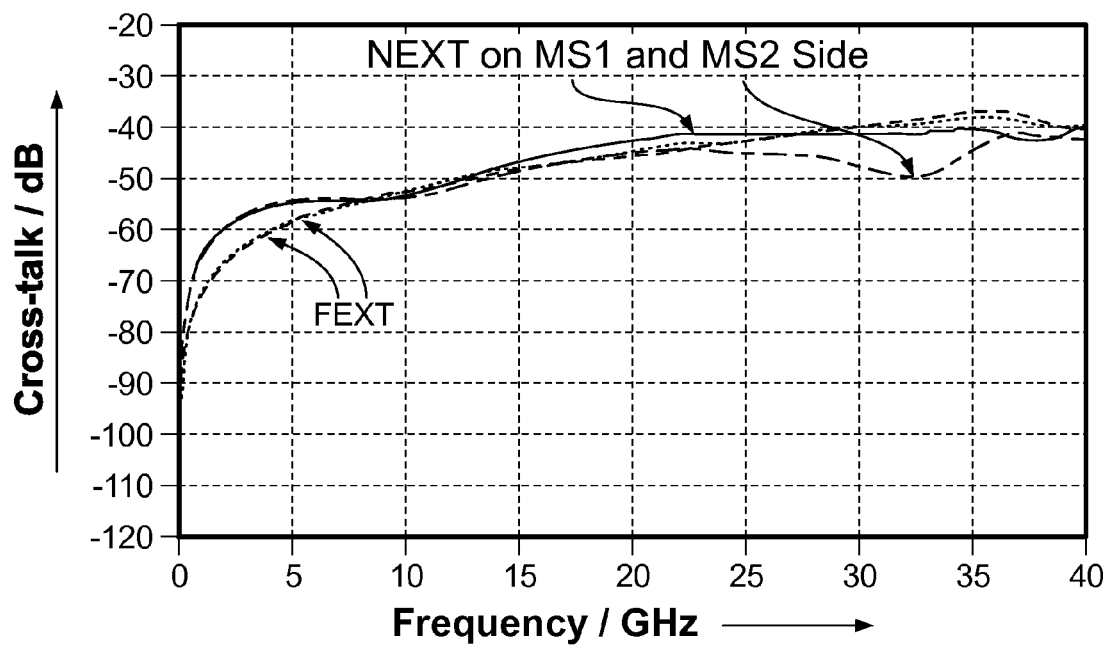
FIG. 14 is a schematic diagram showing near and far end cross-talk for the electrical connection interface shown in FIG. 3.
Figure 15:
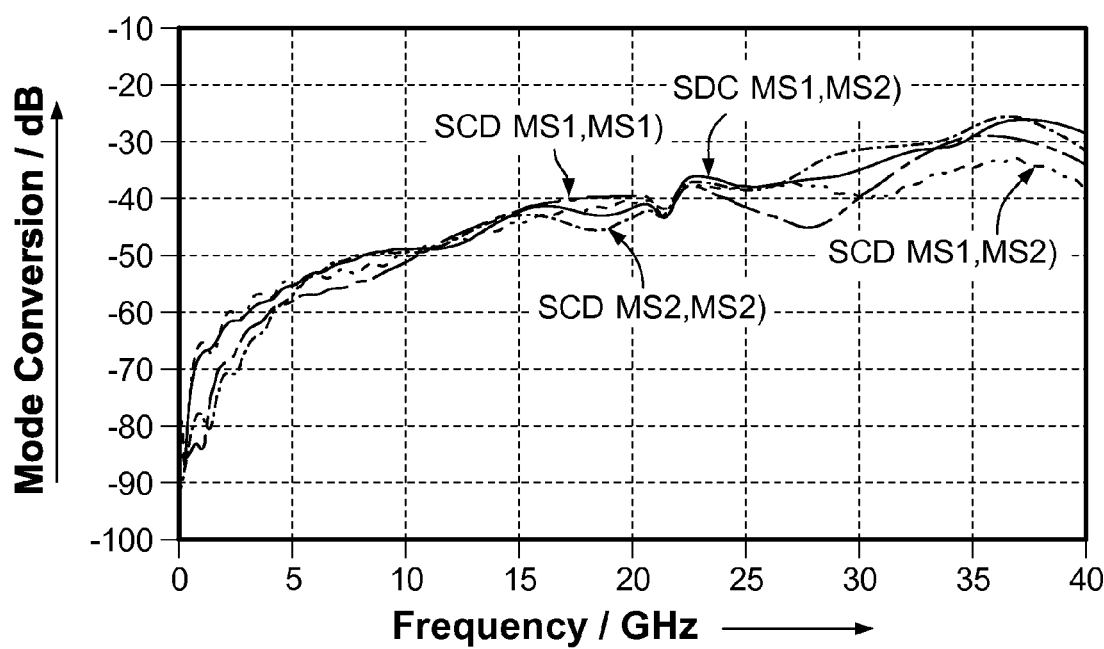
FIG. 15 is a schematic diagram showing a mode conversion for the electrical connection interface shown in FIG. 3.

FIG. 14 shows the near and far end cross-talk for the interconnect shown in FIG. 3 and FIG. 15 shows the mode conversion for the interconnect shown in FIG. 3. For the arrangement according to FIG. 3, the insertion loss vs. cross-talk ratio is about 47 dB at 14 GHz and 30 dB for frequencies beyond 40 GHz.

Figure 16:
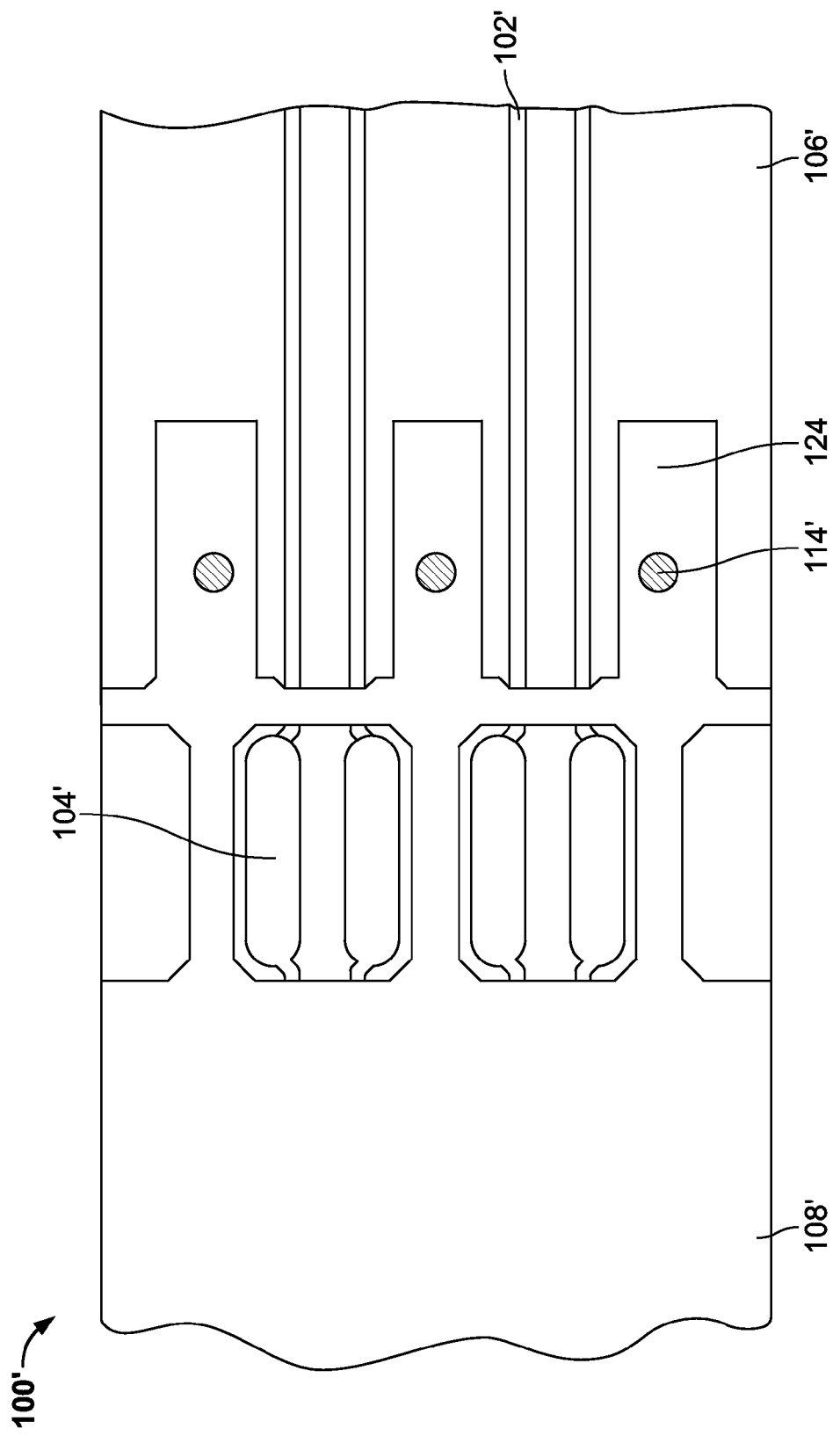
FIG. 16 is a top view of another electrical connection interface according to the invention.

Now with respect to FIG. 16, a top view of another electrical connection interface according to the invention is shown.

Again, a first printed circuit board is connected to a second substrate, however, in contrast, a flexible printed circuit (FPC) is used.

In FIG. 16, only the metallic parts are shown, in particular, the first ground plane layer 106' and the second ground plane layer 108' as well as the first and second electrically conductive leads 102' and 104', respectively. Similar to the embodiments shown in FIGS. 1 to 3, clearances 112' are provided in the second ground plane layer 108' for performing an optimized impedance matching. In contrast to the previous embodiments, however, the connection points 114' between the first and second ground plane layers 106', 108' are not arranged in close vicinity of the clearances, but at a remote location formed by protruding fingers 124. This design also implies a much larger overlap distance d'.

The advantage of this particular embodiment can mainly be seen in the fact that a much more narrow design can be achieved. Furthermore, the mechanical stability of the FPC carrying the second ground plane layer 108' is enhanced thereby. The design according to FIG. 16 may advantageously be used for an FPC to PCB interconnect that is able to connect 12 channels transmitting data rates of 25 Gbps with a still satisfactory signal integrity.

Figure 17:
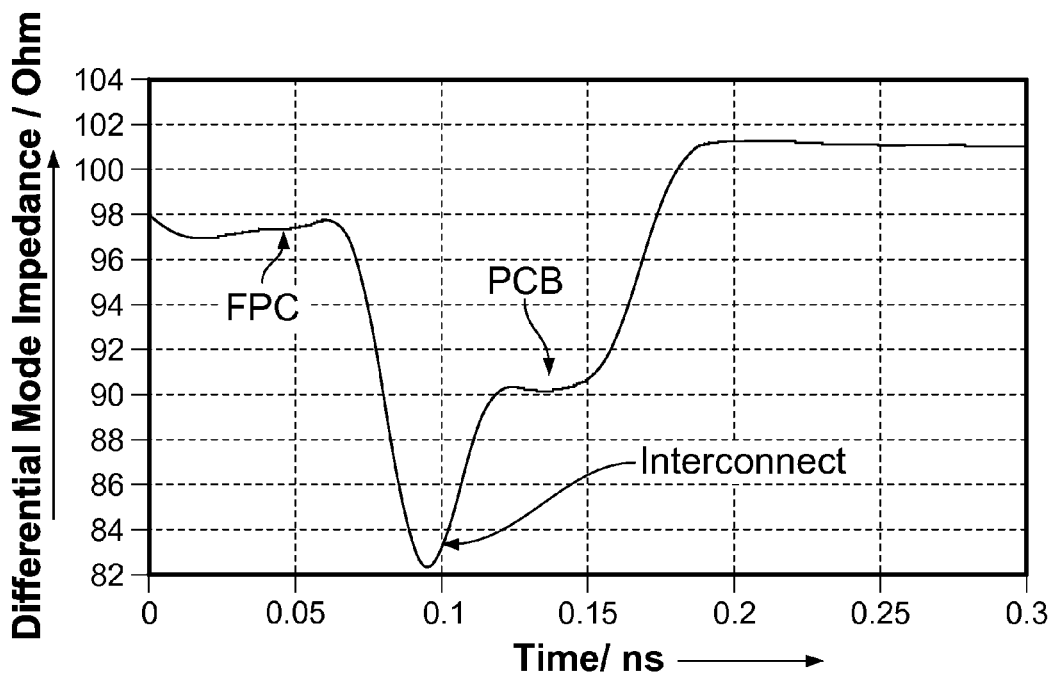
FIG. 17 is a schematic diagram showing a differential mode impedance profile from electrical connection interface of FIG. 16.
Figure 18:
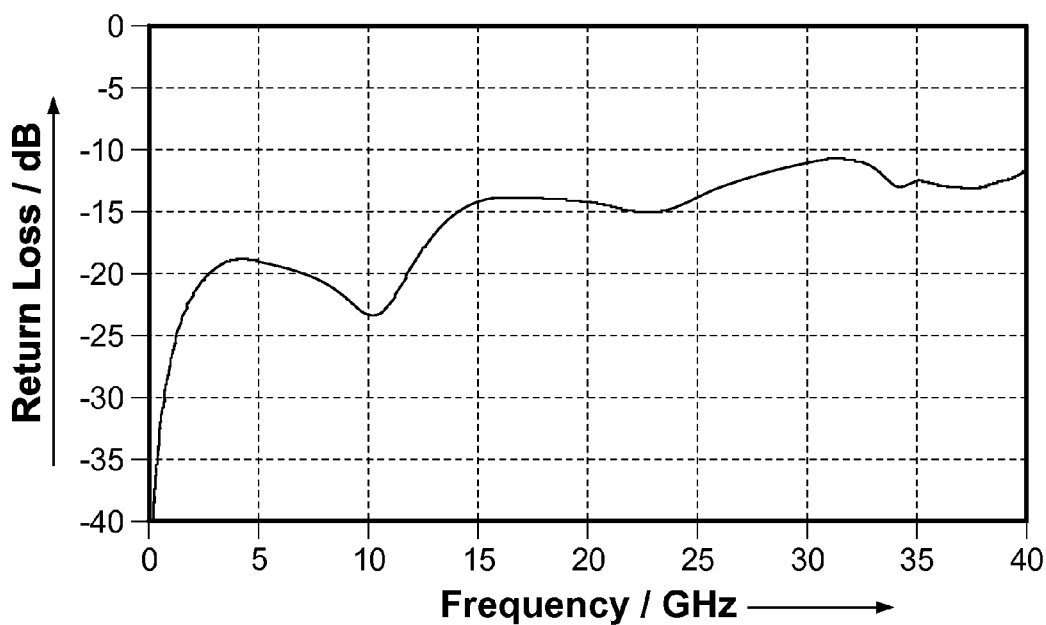
FIG. 18 is a schematic diagram showing a the return loss corresponding to the impedance profile of FIG. 17.

Now with respect to FIGS. 17 to 23, actual performance of the arrangement according to FIG. 16 is illustrated. Specifically, FIG. 17 shows the differential mode impedance profile from the FPC side with a 15 ps 20% to 80% rise time and a nominal impedance of 90Ω for the embodiment shown in FIG. 16, and FIG. 18 shows the return loss corresponding to the impedance profile of FIG. 17.

Figure 19:
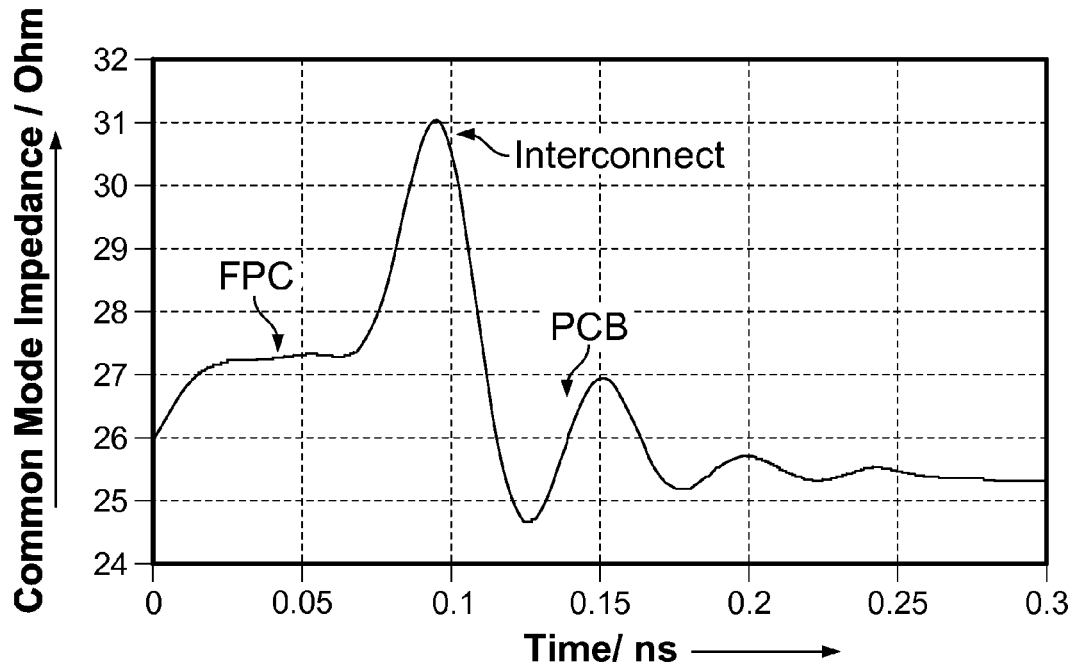
FIG. 19 is a schematic diagram showing a common mode impedance profile of the electrical connection interface of in FIG. 16.
Figure 20:
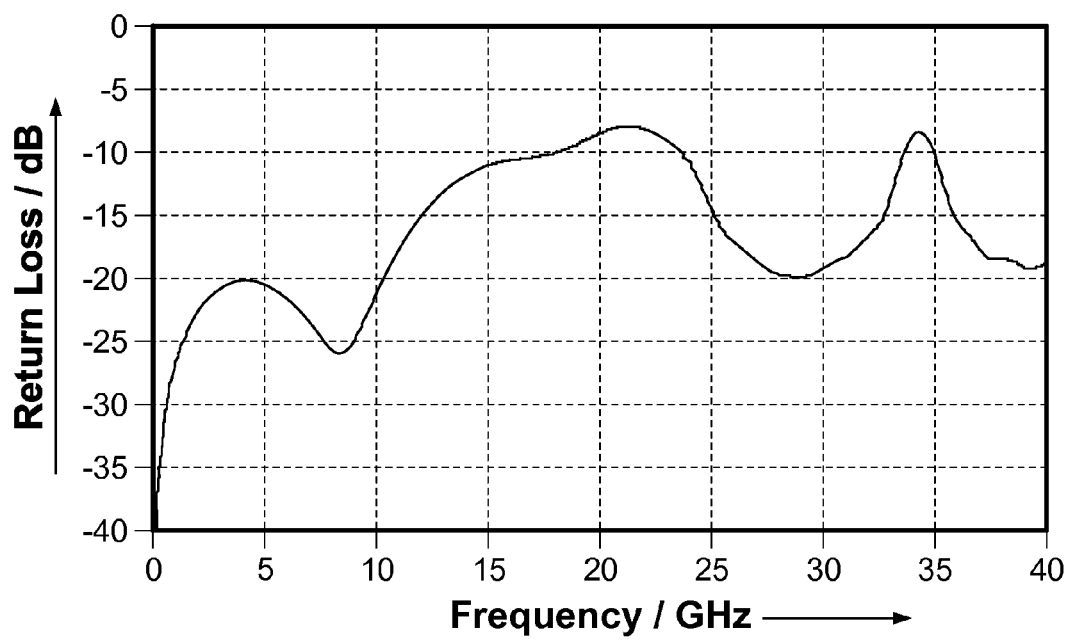
FIG. 20 is a schematic diagram showing a return loss corresponding to the impedance profile of FIG. 19.

FIG. 19 shows the common mode impedance profile from the FPC side with a 15 ps 20% to 80% rise time and a nominal impedance of 22.5Ω for the embodiment shown in FIG. 16, and FIG. 20 shows the return loss corresponding to the impedance profile of FIG. 19.

Figure 21:
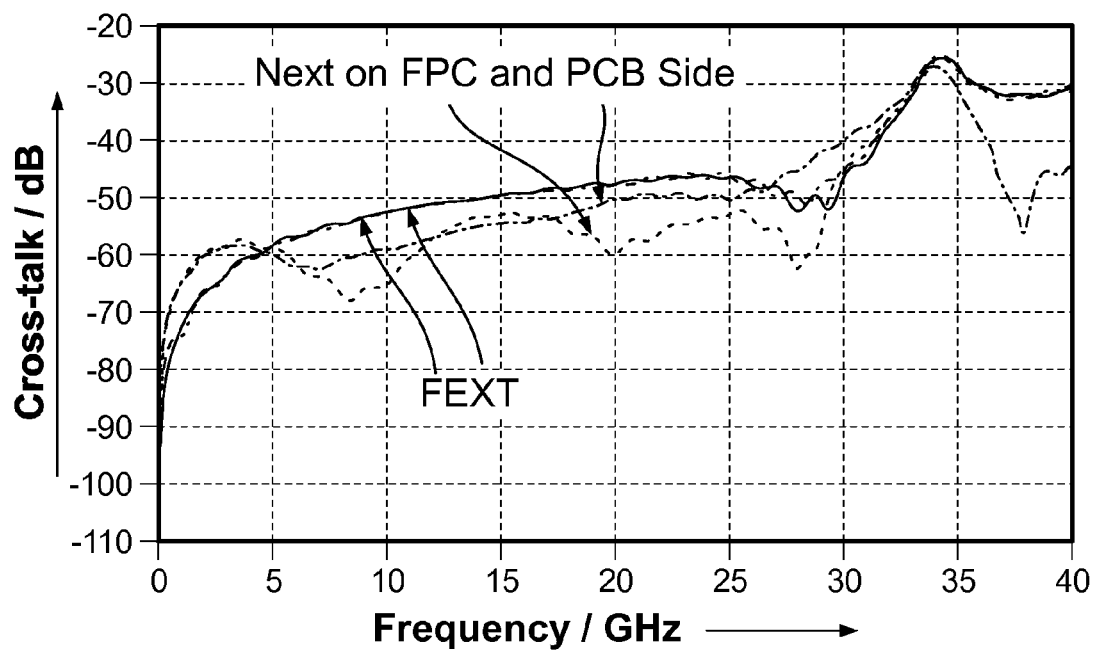
FIG. 21 is a schematic diagram showing a near end and far end cross talk for the electrical connection interface of FIG. 16.
Figure 22:
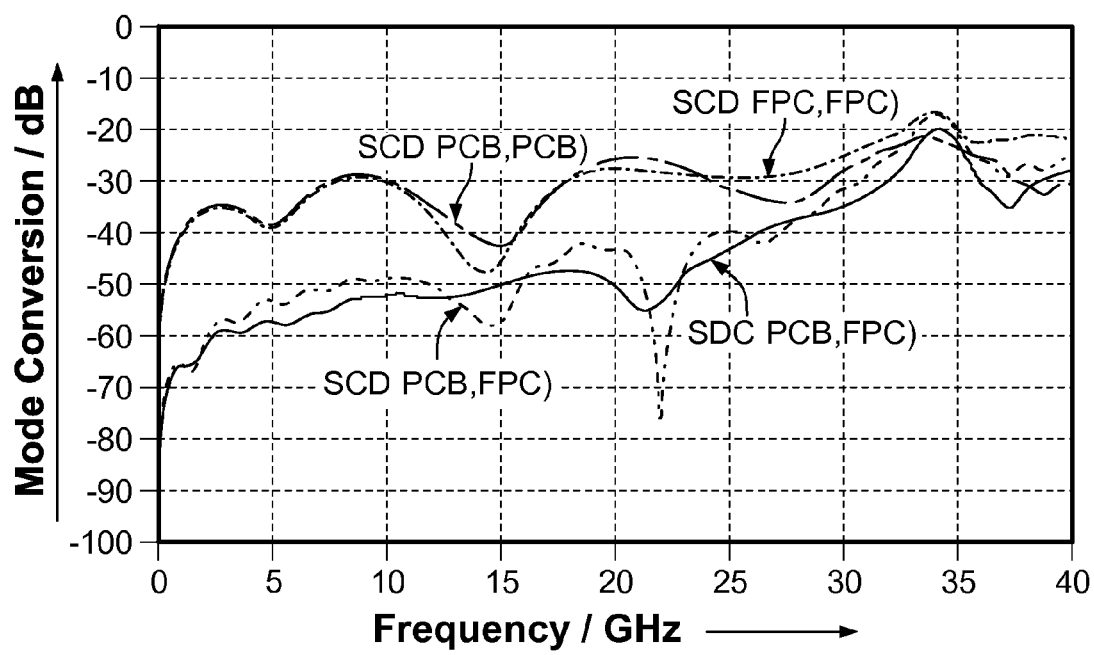
FIG. 22 is a schematic diagram showing a mode conversion for the interconnect of the electrical connection interface of FIG. 16.

FIG. 21 shows the near end and far end cross talk for the interconnect shown in FIG. 16, and FIG. 22 shows the mode conversion for the interconnect according to the embodiment shown in FIG. 16. For the embodiment according to FIG. 16, the insertion loss vs. cross-talk ratio is about 49 dB at 14 GHz and 30 dB at 33 GHz.

The principles of the present invention can advantageously be employed with electro-optical engines (E/O engines), i.e. conversion components which transform electrical signals into optical signals and vice versa. Such E/O engines can be coupled to optical fibers on the one hand and electrical leads on the other hand and light emitting as well as light receiving elements for performing the desired conversion between the electrical and optical domain.

Intensive research has shown that only very specific values for the overlap between the printed circuit board and such an E/O engine circuit carrier lead to satisfying results in all decisive characteristics. In particular, the signal integrity performance, that is, the differential and common mode return loss as well as the crosstalk and mode conversion, has to be sufficiently high. On the other hand, there should be left enough space for the E/O engine, in particular for the IC and the optoelectronic components as well as the necessary thermally conductive material. It could be shown that an overlap distance d in a range between 0.5 and 0.8 mm yields the best results.

Figure 23:
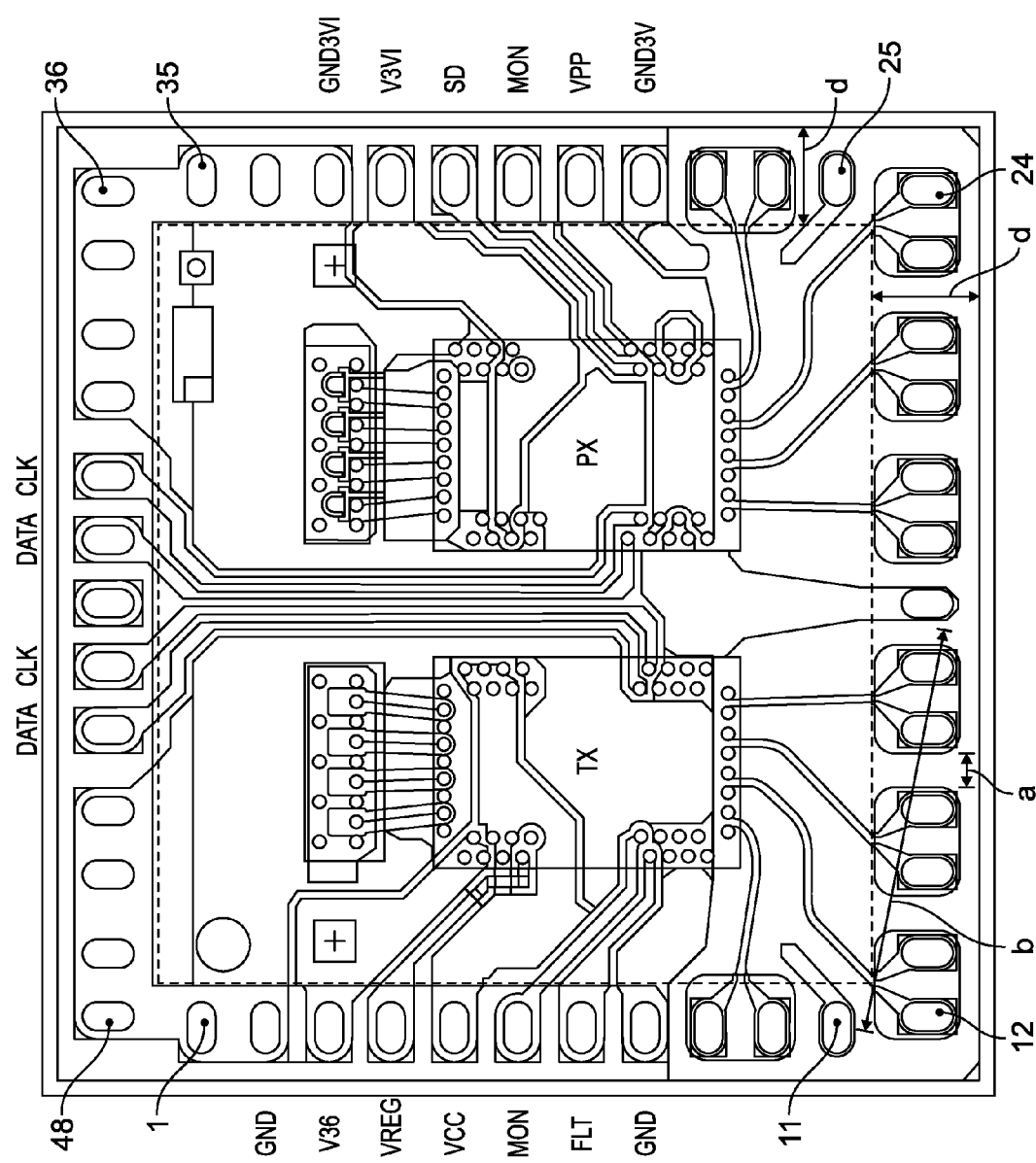
FIG. 23 is a top plan view of a layout diagram of an E/O engine mounted to a printed circuit board using the electrical connection interface according to the invention, showing a GSSSG configuration.

Now with respect to FIG. 23, an example of a layout diagram of an E/O engine mounted to a printed circuit board using the electrical connection interface according to the invention will be discussed. In particular, the E/O engine circuit carrier is mounted over a rectangular cut out of a printed circuit board and the edge 126 of the PCB is indicated by a broken line in the drawing. In the configuration of FIG. 23, a GSSSG configuration is chosen, meaning that always three pairs of differential signal lines are separated by one ground line.

Figure 24:
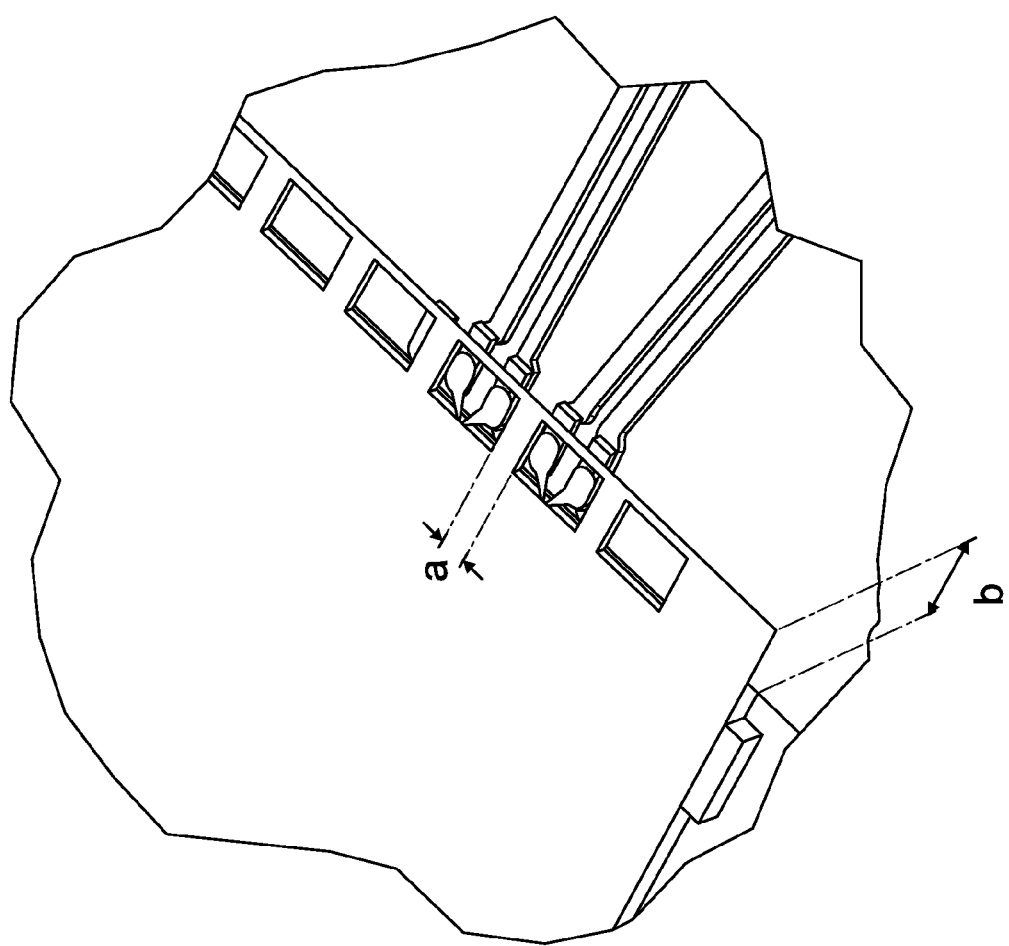
FIG. 24 is a close up perspective view of the electrical connection interface of FIG. 23.

An important parameter to be considered is firstly the minimum distance between the differential signal pairs indicated by reference sign a. This distance has to be at least 0.25 mm in order to ensure sufficient signal integrity. Furthermore, the distance b between two grounding points has to be less than 3.5 mm. Regarding the overlap distance d it could be shown that same should be within the range of 0.5 and 0.8 mm. These particular distances are also highlighted in the schematic detail of FIG. 23 shown in FIG. 24.

Figure 25:
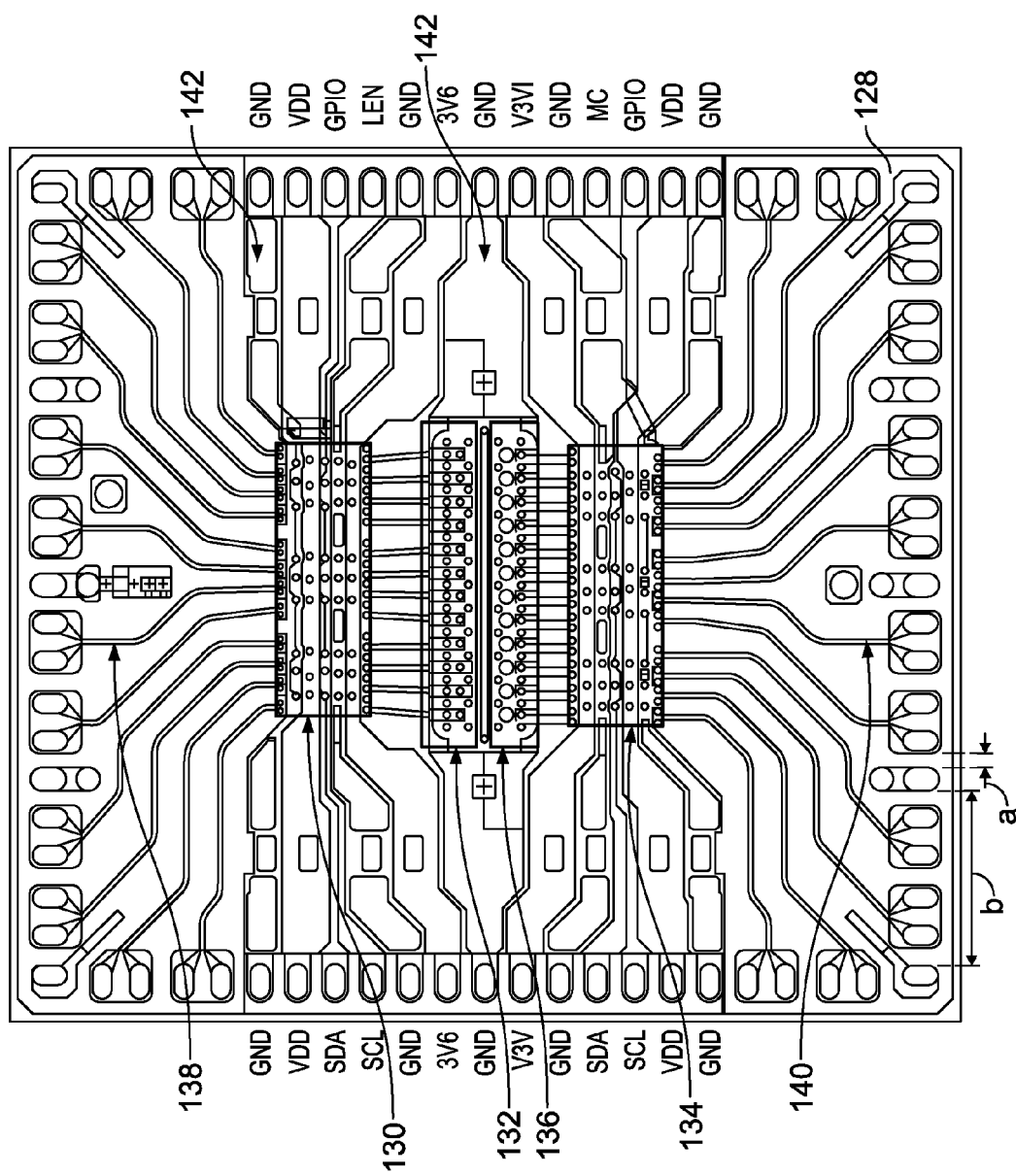
FIG. 25 is a top plan view of a layout diagram of another E/O engine mounted to a printed circuit board using the electrical connection interface according to the invention, showing a GSSG configuration.

FIG. 25 shows a further embodiment of the present invention, in particular an E/O engine, where the signal pairs are arranged in a GSSG configuration, wherein always two pairs of signals are separated by one ground connection. As shown in FIG. 25, the E/O engine component 128 includes an integrated circuit (IC) with drivers 130, an IC having vertical cavity surface emitting lasers (VSCEL) 132, and transimpedance amplifiers (TIA) 134. Furthermore, optical receivers 136, in particular PIN optical receivers, are provided for the conversion of received optical signals into electric signals.

The transmitting differential front end lines 138 and the receiver differential front end lines 140 are arranged in the already mentioned GSSG configuration. Furthermore, vias 142 are provided to connect an additional metal layer. In this particular example, the E/O engine component 128 has for instance dimensions of 9 mm×10 mm. For this particular application, the distance a between two differential signal pairs has to be at least 0.2 mm. Further, the distance b between two ground connections has to be at least 2.5 mm, as indicated in FIG. 25.

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

What is claimed is:

1. An electrical connection interface for electrically coupling a printed circuit board to an electro-optical engine, the electrical connection interface comprising:
    a first ground plane layer associated with the printed circuit board;
    a second ground plane layer associated with the electro-optical engine;
    a first substrate associated with the printed circuit board, the first substrate having a first substrate conductive lead with a first interface region connected to and electrically insulated from the first ground plane layer; and
    a second substrate associated with the electro-optical engine, the second substrate having a second substrate conductive lead with a second interface region connected to the first interface region of the first substrate conductive lead, the second substrate conductive lead connected to and electrically insulated from the second ground plane layer;
    wherein the second ground plane layer associated with the electro-optical engine includes clearance; and
    wherein the first ground plane layer overlaps the second ground plane layer and a dimension of the clearance corresponds to a distance that the first ground plane layer overlaps the second ground plane layer.

2. The electrical connection interface according to claim 1, wherein the first ground plane layer associated with the printed circuit board includes the clearance.

3. The electrical connection interface according to claim 1, further comprising a grounding web and a plurality of clearances separated from each other by the grounding web.

4. The electrical connection interface according to claim 3, wherein the grounding web includes a tapered region.

5. The electrical connection interface according to claim 1, wherein the first substrate includes a pair of first substrate electrical leads including the first substrate conductive lead and the second substrate includes a pair of second substrate electrical leads including the second substrate conductive lead.

6. The electrical connection interface according to claim 5, wherein the pair of first substrate electrical leads are adjacent to a common clearance.

7. The electrical connection interface according to claim 1, wherein an impedance of the first substrate conductive lead matches a characteristic impedance of the second substrate conductive lead.

8. The electrical connection interface according claim 1, wherein the first substrate or the second substrate includes a multilayer printed circuit board, a flexible printed circuit, or a ceramic circuit carrier.

9. The electrical connection interface according to claim 8, wherein the first ground plane layer and the second ground plane layer are formed by a copper layer within or on a surface of the multilayer printed circuit board or the flexible printed circuit.

10. The electrical connection interface according to claim 1, wherein the first ground plane layer and the second ground plane layer are electrically connected to each other by a contact point in an overlapping area.

11. The electrical connection interface according to claim 10, wherein the contact point is adjacent to the first interface region and the second interface region.

12. The electrical connection interface according to claim 10, wherein the clearance is adjacent to the first and second interface regions.

13. The electrical connection interface according to claim 12, further comprising a grounding strip on an outer peripheral region of the clearance.

14. The electrical connection interface according to claim 1, wherein the first substrate conductive lead is connected to the second substrate conductive lead by a solder connection, a press fit connection, or an adhesive.

15. The electrical connection interface according to claim 1, the electro-optical engine comprising at least one optical transmitter or at least one optical receiver, wherein the second substrate conductive lead is electrically coupled to the optical transmitter or the optical receiver.

16. The electrical connection interface according to claim 15, the electro-optical engine further comprising at least one driver or at least one amplifier, wherein the second substrate conductive lead is electrically coupled to the optical transmitter or the optical receiver by way of the driver or the amplifier.

17. An electrical connection interface comprising:
a printed circuit board (PCB) comprising:
   a PCB ground plane layer; and
   a first substrate having first substrate conductive leads with a first interface region electrically insulated from the first ground plane layer;
an electro-optical engine (E/O engine) comprising:
   an E/O engine ground plane layer;
   a second substrate having second substrate conductive leads with a second interface region connected to the first interface region of the first substrate conductive leads, the second substrate conductive leads electrically insulated from the E/O engine ground plane layer, the second substrate conductive leads including transmitting differential lines and the receiver differential lines;
   optical transmitters positioned on the second substrate; and
   optical receivers positioned on the second substrate;
   wherein the optical transmitters are electrically coupled with the transmitting differential lines and the optical receivers are electrically coupled with the receiver differential lines
   wherein the E/O engine ground plane layer includes clearance; and
   wherein the PCB ground plane layer overlaps the E/O engine ground plane layer a distance corresponding to the size of the clearance.

* * * * *